US006395149B1

(12) United States Patent
Palmgren

(10) Patent No.: US 6,395,149 B1
(45) **Date of Patent: *May 28, 2002**

(54) METHOD OF MAKING LIGHT COLORED, ELECTRICALLY CONDUCTIVE COATED PARTICLES

(75) Inventor: Charlotte M. Palmgren, Lake Elmo, MN (US)

(73) Assignee: 3M Innovative Properties Company, St. Paul, MN (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/109,303

(22) Filed: Jun. 30, 1998

(51) Int. Cl.[7] ............................................ C23C 14/34

(52) U.S. Cl. ............................ 204/192.29; 204/192.15

(58) Field of Search ......................... 204/192.1, 192.12, 204/192.15, 192.14, 192.17, 298.13, 192.26, 192.28, 192.29; 428/328, 375, 694 B, 457

(56) References Cited

U.S. PATENT DOCUMENTS

| | | | | | |
|---|---|---|---|---|---|
| 4,078,935 | A | * | 3/1978 | Nakagiri et al. | 428/328 |
| 4,373,013 | A | | 2/1983 | Yoshizumi | |
| 4,431,764 | A | | 2/1984 | Yoshizumi | |
| 4,452,830 | A | | 6/1984 | Yoshizumi | |
| 4,568,609 | A | | 2/1986 | Sato et al. | |
| 4,612,242 | A | | 9/1986 | Vesley et al. | |
| 4,618,525 | A | | 10/1986 | Chamberlain et al. | |
| 4,655,966 | A | | 4/1987 | Gullaamon et al. | |
| 4,848,348 | A | * | 7/1989 | Craighead | 428/328 |
| 4,940,523 | A | * | 7/1990 | Takeshima et al. | 204/192.15 |
| 5,071,676 | A | | 12/1991 | Jacobson | |
| 5,085,671 | A | | 2/1992 | Martin et al. | |
| 5,104,853 | A | | 4/1992 | Richardson | |
| 5,163,975 | A | | 11/1992 | Martin | |
| 5,232,775 | A | | 8/1993 | Chamberlain et al. | |
| 5,238,975 | A | | 8/1993 | Johnson et al. | |
| 5,245,151 | A | | 9/1993 | Chamberlain et al. | |
| 5,254,824 | A | | 10/1993 | Chamberlain et al. | |
| 5,284,705 | A | | 2/1994 | Cahill | |
| 5,294,525 | A | * | 3/1994 | Yamauchi et al. | 428/694 B |
| 5,294,763 | A | | 3/1994 | Chamberlain et al. | |
| 5,296,168 | A | | 3/1994 | Jacobson | |
| 5,336,558 | A | | 8/1994 | Debe | |
| 5,340,746 | A | | 8/1994 | Hagen et al. | |
| 5,350,448 | A | | 9/1994 | Dietz et al. | |
| 5,376,307 | A | | 12/1994 | Hagiwara et al. | |
| 5,389,434 | A | | 2/1995 | Chamberlain et al. | |
| 5,397,920 | A | * | 3/1995 | Tran | 204/192.29 |
| 5,398,153 | A | | 3/1995 | Clough et al. | |
| 5,409,968 | A | | 4/1995 | Clatanoff et al. | |
| 5,446,270 | A | | 8/1995 | Chamberlain et al. | |
| 5,476,613 | A | | 12/1995 | Jacobson | |
| 5,506,053 | A | | 4/1996 | Hubbard | |
| 5,512,094 | A | | 4/1996 | Linton | 106/409 |
| 5,529,708 | A | | 6/1996 | Palmgren et al. | |
| 5,558,977 | A | * | 9/1996 | DePalma et al. | 428/694 B |
| 5,571,456 | A | | 11/1996 | Bergmann et al. | |
| 5,585,037 | A | | 12/1996 | Linton | |
| 5,628,932 | A | | 5/1997 | Linton | |
| 5,631,311 | A | | 5/1997 | Bergmann et al. | |
| 5,712,044 | A | | 1/1998 | Fanselow et al. | |
| 5,756,207 | A | * | 5/1998 | Clough et al. | 428/375 |
| 5,756,936 | A | | 5/1998 | Viebranz et al. | |
| 5,795,631 | A | * | 8/1998 | Parkansky et al. | 428/457 |
| 5,851,674 | A | * | 12/1998 | Pellerite et al. | 204/192.26 |

FOREIGN PATENT DOCUMENTS

| | | | |
|---|---|---|---|
| DE | 42 37 355 A1 | 5/1994 | C09C/3/06 |
| EP | 0 310 340 A1 | 4/1989 | H01B/1/08 |
| EP | 0 852 977 A1 | 7/1998 | B22F/1/02 |
| GB | 2 252 551 A | 8/1992 | C09C/3/06 |
| JP | 53-9806 | 1/1976 | C03C/17/22 |
| JP | 53-9807 | 1/1976 | C03C/17/22 |
| JP | 54-137488 | 10/1979 | C09K/9/00 |
| JP | 58-25363 | 2/1983 | C09C/3/16 |
| WO | WO 95/04652 | 1/1995 | |
| WO | WO 97/33162 | 9/1997 | |

OTHER PUBLICATIONS

Patent Abstracts of Japan—Publication No. 09059015; Publication Date—Mar. 4, 1997 Title: Electroconductive Complex Body And Its Production.

(*ESD Association Advisory for Electrostatic Discharge Terminology*, ESD–ADV1.0–1994, published by the Electrostatic Discharge Association, Rome, NY 13440, pp. 2, 5, 7.).

Hunter, Richard S. and Harold, Richard W., *The Measurement of Appearance*, 2nd Edition, John Wiley and Sons, 1987, pp. 143–145, 177–178.

*Operator's Manual for Monroe Electronics, Inc.*, Model 272A, Portable Surface Resistivity/Resistance Meter, Monroe Application Note ES–41, "Practical vol. Resistivity Measurements", pp. 7–8.

M. Thompson and J. Walsh, *A Handbook of Inductively Coupled Plasma Spectrometry*, Chapman and Hall, 1983.

T. Allen, *Particle Size Measurement*, 3rd edition, Chapman and Hall, pp. 468–481, 1981.

ASTM D1003–97 Standard Test Method for Haze and Luminous Transmittance of Transparent Plastics.

ASTM D257–93 Standard Test Methods for DC Resistance or Conductance of Insulating Materials.

* cited by examiner

*Primary Examiner*—Nam Nguyen
*Assistant Examiner*—Gregg Cantelmo

(57) ABSTRACT

The present invention provides a method of making electrically conductive light colored coated particles that are particularly useful for the manufacture of static dissipative compositions. The coated particles are useful for making static dissipative composites.

39 Claims, No Drawings

METHOD OF MAKING LIGHT COLORED, ELECTRICALLY CONDUCTIVE COATED PARTICLES

FIELD OF THE INVENTION

The present invention provides a method of making electrically conductive, light colored coated particles that are particularly useful for the manufacture of static dissipative compositions. The coated particles are useful for making static dissipative composites.

BACKGROUND OF THE INVENTION

Static electricity is a common problem. In industry, electrostatic discharge (ESD) events can be responsible for equipment failures, manufacturing defects and even explosions of solvents or flammable gases. One method of controlling static electricity is the use of static dissipative materials. Static dissipative materials are often required in manufacturing, the electronics industry and hospital environments. Examples of static dissipative materials include floorings in solvent handling areas and molded plastic trays for handling electronic components.

Static dissipative materials have electrical resistance between insulative and conductive materials. In general, materials that have a surface resistivity of more than $10^{12}$ ohms per square and/or a volume resistivity of more than $10^{11}$ ohm-cm are considered non-conductors, or insulators. Materials that have a surface resistivity of less than $10^5$ ohms per square and/or a volume resistivity of less than $10^4$ ohm-cm are considered conductive. Materials that have surface resistivities or volume resistivities in between these values are considered to be static dissipative. More specifically, static dissipative materials have surface resistivities between $10^5$ and $10^{12}$ ohms per square and/or volume resistivities between $10^4$ and $10^{11}$ ohm-cm. Some static dissipative applications require surface resistivity to be between $10^6$ and $10^9$ ohms per square and/or volume resistivity to be between $10^5$ and $10^8$ ohm-cm. (*ESD Association Advisory for Electrostatic Discharge Terminology*, ESD-ADV1.0-1994, published by the Electrostatic Discharge Association, Rome, N.Y. 13440.)

Surface resistivity is measured across the surface of a material. A typical method for measuring the surface resistivity of a material is to place electrodes on the surface, and then measure the resistance between the electrodes. The dimensions of the electrodes and distance between them is used to convert the resistance to surface resistivity in units of ohms per square.

Volume resistivity is measured through the bulk, or volume, of a material. A typical method for measuring the volume resistivity of a material is to place electrodes on the upper and lower surfaces of the material, and then measure the resistance between the electrodes. The area of the electrodes and thickness of the composite are used to convert the resistance to volume resistivity in units of ohm-cm.

Many commonly used materials are non-conductive. Examples of these are polymers, such as polyethylene or polysulfone, and epoxy resins, such as bisphenol A based resins. One method for making these materials static dissipative is to add conductive particles to them. Those non-conductive materials which are made static dissipative by adding conductive particles are called static dissipative composites. In order to make a non-conductive material static dissipative, conductive particles must be added in sufficient quantity to create a network of conductive paths through the material. These paths are formed by the conductive particles in electrical contact with each other. The level of conductivity depends on the number of conductive paths created by the particles. If there are too few particles, there will not be enough conductive paths to provide static dissipative properties to the composite.

Traditional conductive particles for static dissipative composites include carbon, graphite, and metal. These particles have several disadvantages. They are difficult to disperse and the static dissipative properties are strongly dependent on particle filling. This makes it difficult to produce composites within the desired conductivity range. These conductive particles are also dark in color and impart a dark color to the static dissipative composite.

JP SHO 53(1978) 9806 and SHO 53(1978) 9807 (Mizuhashi et al) teach glass microspheres with conductive indium oxide or tin oxide or indium tin oxide coatings. The object of JP SHO 53 (1978) 9806 is to produce glass microspheres with high conductivity without increasing the reflectivity of light too much. This reference teaches glass microspheres of transparent soda lime silicate glass, boron silicate glass, lead silicate glass, etc. with a low refractive index or high reflective index, or containing a coloring component. The manufacturing process includes a film formation process in which a solution containing a solvent, comprising water and/or a lower alcohol, a soluble-indium compound, and an organic thickener, is coated onto the surface of the glass microspheres to form a film on the surface of the glass microspheres. The next step is a drying process, in which the glass microspheres having a surface film formed from the above-mentioned solution are dried to evaporate the solvent in the film, and to form a film mainly composed of the above-mentioned indium compound and an organic thickener on the glass microspheres. This is followed by a baking process, in which the above-mentioned glass microspheres are baked in an oxidizing atmosphere at a high temperature to form a transparent coating mainly composed of indium oxide on the surface of the glass microspheres. A soluble tin compound can also be included with the soluble indium compound to form an indium tin oxide coating.

JP SHO 53 (1978) 9807 describes a method for making tin oxide coated microspheres that includes a solution production process in which an organic tin compound containing oxygen is dissolved in an organic solvent to produce a solution. The next step is a solution coating process in which the above-mentioned solution is coated onto the surface of glass microspheres to form a film on the surface of the glass microspheres. This is followed by a drying process in which the above-mentioned glass microspheres are dried under reduced pressure to form a resin-like film containing the organic tin compound on the surface of the glass microspheres. The final step is a baking process in which the above-mentioned glass microspheres are heated at a high temperature and under reduced pressure so that thermal decomposition of the organic tin compound is carried out to form a transparent tin oxide film on the surface of the glass microspheres.

Neither JP SHO 53(1978) 9806 nor JP SHO 53(1978) 9807 make reference to particles containing voids, such as hollow glass microspheres, nor do they disclose particles that have non-spherical shapes, such as glass fibers. These references also do not disclose the use of these particles for static dissipative composites. Both of these references declare that other methods for coating particles with diameters of 1 min or less, such as sputtering, vacuum deposition, and chemical deposition are "difficult to apply," and state that "uniform formation of the film over the entire surface on the sphere is not possible," and "production equipment becomes expensive."

JP SHO 58(1983)-25363 (Tanaka) teaches pigment particles coated with indium oxide or tin oxide for conductivity. The particles are described as inorganic pigments. Inorganic pigment particles of the type listed in this reference are typically very small, on the order of several microns or less. This reference makes no reference to spherical particles, including those containing voids, such as hollow glass microspheres. Fibers other than asbestos are not taught. The objective of this invention is to provide a method of producing an inexpensive conductive pigment that can be used effectively as a recording material in electrophotographic or electrostatic recording systems or recording systems in which a color is formed by the passage of an electric current, and that can also be used to provide antistatic properties to polymer films, etc. This reference does not teach how to provide antistatic properties to polymer films, for example by describing the amount of conductive particles required for antistatic properties. The process for making these conductive pigments involves baking the pigments at a temperature between 400° C. and 1000° C. in the presence of indium or tin compounds.

U.S. Pat. No. 4,373,013 and U.S. Pat. No. 4,452,830 (both Yoshizumi) teach particles of titanium dioxide coated with antimony doped tin oxide (ATO). These inventions relate to " . . . a coated electroconductive powder suitable for use in applications such as forming electroconductive layers on paper for reproduction or duplication, such as electrothermosensitive paper and electrostatic recording paper, and addition to resins to provide antistatic resins." The titanium dioxide particles of these patents preferably are "generally solid and have a specific surface area (BET method, $N_2$ adsorption) in the range of 1 to 20 meter$^2$/gram (m$^2$/g) (corresponding to an average particle size of 0.07 to 1.4 micrometers) . . . ." The thickness of the ATO coating is preferably in the range of 0.001 to 0.07 micrometers (1 to 70 nanometers). The process for producing these electroconductive powders includes " . . . providing an aqueous dispersion of titanium oxide particles; providing a solution containing a hydrolyzable tin salt and a hydrolyzable antimony salt, said solution remaining free of hydrolyzed tin salt and hydrolyzed antimony salt; adding said solution to said dispersion under agitation while said dispersion is maintained at a temperature of 60° to 100° C., to hydrolyze said tin salt and said antimony salt as a result of contact between said solution and said dispersion, thereby to produce titanium oxide particles coated with antimony-containing tin oxide; and recovering the coated titanium oxide particles."

U.S. Pat. No. 4,568,609 (Sato et al) teaches a light permeable, electrically conductive material comprising a light permeable plate shaped particle, for example mica or glass flakes, with a conductive coating of "metal oxides doped with different kinds of metals." This material " . . . when compounded with transparent synthetic resin films or paints, is capable of providing a film or paint film with a superior conductivity without spoiling the transparency of said film or paint film." According to Sato, "[t]he plate substrate used for the present invention is itself required to be light permeable. The term used herein 'light permeable substrate' or 'light-transmittable plate substrate' implies such a plate substrate that when 2 wt % of the plate substance and 98 wt % of ethylene glycol are mixed, the resulting mixture is placed in a quartz cell having 1 mm of optical path length, and its transmittance is measured by means a hazemeter manufactured by SUGA Tester K.K. in Japan on the basis of the standard of ASTM D1003, the transmittance is evaluated to be 80% or more." Typically this measurement is referred to as "Total Luminous Transmission" or TLT. Therefore Sato requires that his core particles, which are plate shaped, have a TLT of greater than 80%.

This reference also teaches the use of these particles compounded into paints, plastics, or epoxies to form a light permeable, conductive film.

The process for making these coated particles includes preparing a plate substrate dispersion in an aqueous hydrochloric acid solution. A solution is made by dissolving tin and antimony chloride in concentrated hydrochloric acid, and this solution is dropped slowly in said mica dispersion and mixed. Metal hydroxides precipitate from the solution, coating the plate substrate. The coated plate substrates are washed and dried, then calcined at 350° to 850° C.

This reference states " . . . a spherical particle, even if conductive, has a narrow surface area as compared with different-shaped particles, and accordingly the probability of spherical particles contacting mutually is also low. Therefore, when intending to compound conductive spherical particles for instance with a film for providing said film with conductivity, it is impossible to render the film conductive satisfactorily without considerably increasing the amount of particles to be compounded." This patent makes no reference to fibers or hollow particles.

U.S. Pat. No. 5,071,676 and U.S. Pat. No. 5,296,168 (both Jacobson) teach " . . . an electroconductive powder composition comprising tens of microns to micron size particles having a surface coating layer of antimony-containing tin oxide which is conducting and an outer thin layer of a hydrous metal oxide having a thickness of from a partial molecular layer to 5 monomolecular layers, i.e., from about 5 to 30 angstroms, and an isoelectric point in the range of from about 5 to 9." Examples of the particles are titanium dioxide and amorphous silica. According to Jacobson, "[t]he hydrous metal oxide contemplated for use in the invention is an essentially non-conducting oxide . . . " The isoelectric point represents the pH at which the surface of each particle has zero electrical charge, and, thereby, interactions of the individual particles with the resins of the paint system can controlled. These electroconductive powders are used as "pigments or additives in coating systems, such as for antistatic conductive paperboard." In addition, according to Jacobson, "[a]nother important use for electroconductive powders is as a component of the pigment in automotive paint primer compositions . . . "

U.S. Pat. No. 5,104,583 (Richardson) teaches a "light colored conductive electrocoat paint" or "cathodic coatings." According to Richardson "[t]he electrically conductive pigment of the invention is a two-dimensional network of crystallites of antimony-containing tin oxide which exists in a unique association with amorphous silica or a silica-containing material. The antimony-containing tin oxide forms a two-dimensional network of densely packed crystallites on the surface of the silica or silica-containing material."

U.S. Pat. No. 5,284,705 (Cahill) teaches "an antistatic coating composition comprising a pigment portion dispersed in a fluent portion, the fluent portion containing a curable film-forming binder, the pigment portion containing tin oxide-rich electrically-conductive pigment, the proportion of said binder relative to the solids of said pigment portion being sufficiently high to provide a binder-continuous film when said composition is deposited and cured as a film on a substrate, the composition being characterized by an electrical conductivity-enhancing proportion of hard, impalpable achromatic filler mineral blended with said tin oxide-rich pigment."

U.S. Pat. No. 5,350,448 (Dietz et al.) teaches electrically conductive pigment particles. The coating that provides the conductivity is a halogen doped tin oxide and/or titanium oxide. These pigment particles optionally have a coating between the pigment particle and the conductive coating, which can be a metal oxide. This optional coating is provided for color or pearlescent appearance. The processes for making these include fluidized beds and wet chemical baths with tin or titanium chlorides and ammonium halides.

U.S. Pat. No. 5,376,307 (flagiwara et al.) teaches a perfluorocarbon paint composition which has an "excellent anti-electrostatic property and release property." The composition is " . . . a fluorocarbon paint composition containing a fluorocarbon resin; and a hollow double-shell electroconductive material comprising hollow inner shells and outer shells coated on the surface of the inner shells and formed substantially of an electroconductive oxide; the ratio of the hollow double-shell electroconductive material in a coating component of the fluorocarbon paint composition being in the range of 1% to 30% by volume . . . . " This hollow double-shell electroconductive particle is then described as "having hollow inner shells formed substantially of amorphous silica or a silica-containing material, and outer shell formed substantially of tin (IV) oxide containing or doped with about 1% to 30%, preferably about 10%, by weight of antimony." According to Hagiwara, "[t]he paint according to this invention is suited not only for spray, brush or roll coating, but also for flow coating or immersion in applications where painting with relatively low viscosity is desired." In addition Hagiwara states, "[t]ypical applications of the fluorocarbon paint composition of the invention are for fusing rolls or fusing belts used in copying machines and printers, where the paint composition provides surfaces with both release property and anti-electrostatic characteristics . . . " Additionally, "[t]he paint composition of the invention may be used to provide coatings surfaces of, for example, hoppers for transporting powder material, sizing rolls in paper manufacturing, feed rollers used in plastic film extruder, and textile sizing and drying rolls."

U.S. Pat. No. 5,398,153 (Clough) teaches fluorine and antimony doped tin oxide coatings on three dimensional substrates for use in static dissipative materials. Examples of these three dimensional substrates include "spheres, extrudates, flakes, single fibers, fiber rovings, chopped fibers, fiber mats, porous substrates, irregularly shaped particles, . . . " Clough's process "comprises contacting the substrate with stannous chloride, in a vaporous form and/or in a liquid form, to form a stannous chloride-containing coating on the substrate; contacting the substrate with a fluorine component, i.e., a component containing free fluorine and/or combined fluorine (as in a compound), to form a fluorine component-containing coating on the substrate; and contacting the thus coated substrate with an oxidizing agent to form a fluorine doped tin oxide, preferably tin dioxide, coating on the substrate."

U.S. Pat. No. 5,476,613 (Jacobson) relates to an "electroconductive material comprising an intimate mixture of amorphous silica and a fine crystalline antimony-containing tin oxide, and to a process for preparing the same." According to Jacobson, "[t]he electroconductive powders of the invention when formulated with appropriate binders and additives may be applied to a variety of surfaces to impart electrical conductivity and antistatic properties . . . " Additionally, "these ECP's are useful for coating glass, paper, corrugated boxboard, plastic film or in sheet such as polycarbonate, polyester and polyacrylate, electroconductive paint coatings, among many others." The term "ECP" as used in the reference refers to electroconductive powder.

U.S. Pat. No. 5,585,037 and U.S. Pat. No. 5,628,932 (both Linton) teach " . . . an electroconductive composition which comprises a two-dimensional network of crystallites of antimony-containing tin oxide which exists in a unique association with amorphous silica or a silica-containing material." One aspect of the invention is particles of amorphous silica that are coated with a two-dimensional network of antimony-containing-tin oxide crystallites. "The composition of this invention in a preferred embodiment comprises a powder which is particularly useful as a pigment in paint formulations for automotive paint systems. The finished powder of this invention comprises particles capable of forming a generally transparent conductive network with the paint film . . . "

U.S. Pat. No. 5,631,311 (Bergmann et al.) teaches transparent static dissipative formulations for coatings. These electroconductive coatings "are comprised or consist of fine particles of an electroconductive powder, a thermoplastic or thermosetting resin, an organic solvent . . . " According to Bergman, "[f]or the coatings of this invention to be transparent, the conductive powder is preferably comprised mostly of fine particles of size less than about 0.20 microns, that is smaller than half the wavelength of visible light." Also, "[t]he electroconductive coatings of the present invention are particularly useful in packaging materials whip can be used, for example, to transport electronic parts."

U.S. Pat. No. 4,618,525 (Chamberlain et al) teaches metal coated hollow glass microspheres. This patent discloses tin oxide and aluminum oxide coatings as colorless coatings but does not provide examples of these coatings. This patent does not disclose tin oxide or aluminum oxide coatings as being conductive. This reference discloses a procedure for making coated particles by means of either sputter coating or vapor deposition, both of which are forms of physical vapor deposition (PVD).

U.S. Pat. No. 5,232,775 (Chamberlain et al) discloses particles with semiconductive metallic coatings for use in static dissipative polymeric composites. These coatings are preferably metal oxides, metal carbides and metal nitrides. Examples of the useful particles include " . . . particles fibers, milled fibers, mica and glass flakes, glass and polymeric microbubbles, talc and (subsequently coated) crushed microbubbles." The color of the coated particles or composites made from them is not disclosed. In fact, the coated particles and composites of the examples would all be expected to be brown to black in color. The coated particles of this reference are made by means of a sputter coating process.

U.S. Pat. No. 5,409,968 (Clatanoff et al) discloses metal coated particles for use in static dissipative polymeric composites. These particles are coated with a highly conductive metal followed by a coating of an insulating metal oxide. Examples of useful metals for the highly conductive metal layer include stainless steel and aluminum. An example of a useful insulating metal oxide layer is aluminum oxide. Examples of useful particles are glass, carbon, mica, clay polymers, and the like. The particles preferably have a high aspect ratio, such as fibers, flakes, rods, tubes and the like. The colors of these composites are not disclosed. The coated particles of this reference are made by means of a sputter coating process.

U.S. Pat. No. 4,612,242 (Vesley et al.); U.S. Pat. No. 5,245,151 (Chamberlain et al.); U.S. Pat. No. 5,254,824 (Chamberlain et al.); U.S. Pat. No. 5,294,763 (Chamberlain et al.); U.S. Pat. No. 5,389,434 (Chamberlain et al.); U.S. Pat. No. 5,446,270 (Chamberlain et al.); and U.S. Pat. No. 5,529,708 (Palmgren et al.) teach metal coated particles and metal oxide coated particles for various applications. These patents do not make reference to light colored coatings of conductive metal oxides.

Metal coated particles, as taught by U.S. Pat. Nos. 4,618,525, 5,232,775, and 5,409,968, and those of the paragraph above, such as glass microspheres or milled glass fibers that are coated with steel or aluminum can be dispersed easily into resins and polymers. They also have the advantage that once a minimum loading level is achieved the static dissipative properties of the composite are not strongly dependent on the filler concentration. This allows a better processing range for the filled material.

Another advantage of metal coated particles is the efficient use of metals. The core particle is effectively an extender of the metal. Metal coated particles can have the properties of metal particles, for example, conductivity, yet contain only a fraction of the metal. This is especially advantageous when expensive metals, such as indium, are used. In addition, metal coated particles are low in density when compared to solid metal particles. Metal coated hollow particles can have densities under 1 gm/cc. Even metal coatings on solid core particles, for example, steel coated glass fibers, can have densities less than 3 gm/cc, which is less than that of most metals.

Spherical particles have the additional advantage that they can be used at high volume loadings, without significantly increasing the viscosity of a resin. This allows the formulation of low viscosity, self-leveling composites for floorings and other coatings. This ability to use high volume loadings of spherical particles is also useful when volatile organic compounds (VOC's) need to be reduced in a composite formulation. Also, spherical particles do not line up when applied by such as a brush in a coating, or forced through an extruder die, such as when making a molded part. Fibers and flakes, on the other hand, do have a tendency to align when applied or extruded. This alignment can adversely affect the composite conductivity.

The metal coated particles are prepared by applying conductive coatings to the core particles using physical vapor deposition, in particular, sputter deposition. This physical vapor deposition process is surprisingly efficient and cost effective for producing coated particles. In addition, it is an environmentally clean process that does not involve solvents or liquid waste material. The coating material is almost entirely captured on the core particles. When using sputter deposition, the major source of waste is the metal left in the spent sputtering target. This metal is in a solid form that is easily reclaimable and recyclable. Alternative manufacturing processes, particularly wet chemical processes, involve disposal or recovery of contaminated liquids or solvents. There is often a great deal of metal in these liquids, which can be difficult to recover.

Metal coated particles do, however, impart color to composites. The coated particle color can vary from gray to black, or the coated particles can have a metallic color, such as copper, depending on the type of metal coating and the thickness of the coating. This has been a disadvantage in efforts to develop a market for metal coated particles for floorings and coatings in particular, especially when light colors are desired.

SUMMARY OF THE INVENTION

This invention provides a method of making a composition comprising coated particles that are surprisingly both conductive (thus providing the coated particles with the desired volume resistivity) and light colored. These coated particles are made by coating a core particle with a conductive metal oxide in order to provide a conductive coated particle that is light colored. Static dissipative composites can be made with these coated particles. This invention also provides the coated particles made according to the method of the invention.

The property "light-colored" is quantified herein using the CIELAB color difference formula which uses perfect white as a reference. This provides a single number, $\Delta E_w{}^*$, that indicates the "distance from white." The smaller $\Delta E_w{}^*$ is the closer the material is to a white color. This method is described later herein. Materials having a $\Delta E_w{}^*$ of less than about 50 are considered to be light colored. The term "light colored" includes, for example, white, off-white, light yellow, light pink, light green, light beige, light gray, and, in general, weak tones of a neutral nature.

The coated particles of the invention provide the known advantages of metal coated particles, such as efficient use of metal, low density, ease of dispersion and processing latitude. However, they provide the additional very desirable advantage of imparting very little color to Composites made with them. Static dissipative composites that are light colored can be provided from these coated particles.

The physical vapor deposition process (PVD) for making the coated particles of the invention is efficient and cost effective. No solvents are used, nor are liquid wastes generated. For sputter coating PVD processes, the major source of waste is in the used metal or metal oxide sputtering target. This metal or metal oxide is easily reclaimable and recyclable.

When using spherical particles of the invention to make static dissipative composites an advantage is the ability to use high volume loadings of said spherical coated particles to reduce volatile organic compounds (VOC) without greatly increasing the viscosity of the uncured mixture. This is in addition to the preferable advantage of having a light color.

The method of the invention comprises the steps of:

(a) providing a plurality of core particles wherein each particle independently comprises a material selected from the group consisting of inorganic materials and polymeric materials;

(b) applying a conductive coating comprising a conductive metal oxide on each particle by physical vapor deposition such that the conductive oxide coating is adhered to each core particle, in order to form a composition comprising a plurality of coated particles, wherein the coated particles have a $\Delta E_w{}^*$ value; and (c) optionally heating the composition in an atmosphere comprising oxygen to decrease the $\Delta E_w{}^*$ value of the coated particles;

wherein the coated particles have a volume resistivity of greater than about 0.1 ohm-cm and less than about 1000 ohm-cm; and wherein at least one of the following of (I) and (II) is true:

(I) wherein the coated particles after step (b) have a $\Delta E_w{}^*$ value of less than about 50 (preferably less than about 40, more preferably less than about 30);

(II) wherein the coated particles after step (c), if included, have a $\Delta E_w^*$ value of less than about 50 (preferably less than about 40, more preferably less than about 30).

In one embodiment of the method of the invention the composition comprises a plurality of coated particles, wherein each coated particle independently comprises:

(a) a core particle, wherein the core particle is selected from the group consisting of glass fibers, ceramic fibers, ceramic ellipsoids containing void(s) such that the total volume of the void(s) is about 10 to about 98 percent of the total volume of the ceramic ellipsoids, glass ellipsoids containing void(s) such that the total volume of the void(s) is about 10 to about 98 percent of the volume of the glass ellipsoids;

(b) a coating comprising a conductive indium tin oxide adhered to the core particle;

wherein the coated particles have a $\Delta E_w^*$ value of less than about 50 and wherein the coated particles have a volume resistivity of greater than about 0.1 ohm-cm and less than about 1000 ohm-cm.

The coated particles made according to the method of the invention can be used to make a composite comprising:

(a) a polymeric binder; and (b) a composition, wherein the composition comprises a plurality of coated particles made according to the method of the invention, wherein each coated particle independently comprises:

(i) a core particle, wherein each core particle independently comprises a material selected from the group consisting of inorganic materials and polymeric materials; and (ii) a coating comprising a conductive metal oxide, wherein the coating is adhered to the particle;

wherein the coated particles have a $\Delta E_w^*$ of less than about 50 and wherein the coated particles have a volume resistivity of greater than about 0.1 ohm-cm and less than about 1000 ohm-cm; and wherein at least one of the following of (I) and (II) is true:

(I) the composite has a surface resistivity of $10^5$ to $10^{12}$ ohms per square;

(II) the composite has a volume resistivity of $10^4$ to $10^{11}$ ohm-cm.

For an even more preferred composite at least one of the following of (I) and (II) is true:

(I) the composite has a surface resistivity of $10^6$ to $10^9$ ohms per square;

(II) the composite has a volume resistivity of $10^5$ to $10^8$ ohm-cm.

With respect to the composite preferably the coated particles are combined with the polymeric binder of (a) at a volume loading of 5% to 65% based on the total volume of the composite.

The composite may, for example, be selected from the group consisting of flooring, molding compounds, liquid applied coatings and paints.

DETAILED DESCRIPTION OF THE INVENTION

The method of making the light colored conductive coated particles, the particles themselves and composites made therefrom, are described in greater detail herein.

Core Particles

Core particles (i.e., uncoated particles) useful according to the present invention comprise material selected from the group consisting of inorganic m materials and polymeric materials. Examples of useful inorganic materials include, but are not limited to, glass; ceramic(s); mineral(s) such as wollastonite, mica, perlite, etc., and mixtures thereof. Examples of useful polymeric materials include, but are not limited to, polycarbonate, nylon, acrylonitrile-butadiene-styrene copolymer, etc., and mixtures thereof.

The shape of the core particles can vary. Examples of shapes that are useful for this invention include, but are not limited to, granules, plates, flakes, acicular, rods, fibers, irregular, and ellipsoidal, which includes, but is not limited to spherical (such as microspheres). These core particles can be solid or they can be hollow, i.e., contain one or more voids. A void is defined to be a cavity totally contained within the particle. A hollow particle is defined to be a particle that contains one or more voids.

Core particles that are hollow, i.e., contain one or more voids, can be effective scatterers of light if there is sufficient total void volume. It is believed that the void spaces in these particles redirect the light that passes into them. This gives the appearance of a diffuse brightness that also minimizes any color in the particles and resin. In order to achieve this light scattering effect, the preferred total void volume in a particle ranges from about 10 to about 98% volume total voids, more preferably from about 25 to about 95% volume total voids, based on the total volume of the particle. The void space can be substantially one space, as in a hollow unicellular particle, or the void space can be multiple small voids. Preferably the hollow core particles with void spaces are selected from the group consisting of hollow glass microspheres, hollow ceramic microspheres, and mixtures thereof.

Examples of specific useful core particles include, but are not limited to, those selected from the group consisting of hollow glass microspheres, solid glass microspheres, hollow ceramic microspheres, solid ceramic microspheres, glass fibers, ceramic fibers, wollastonite fibers, mica flakes, glass flakes, glass frit, perlite, polycarbonate granules, polycarbonate microspheres, polycarbonate fibers, nylon granules, nylon microspheres, nylon fibers, acrylonitrile-butadiene-styrene (ABS) granules, ABS microspheres, ABS fibers, etc., and mixtures thereof.

Preferably, the core particles are selected from the group consisting of hollow glass ellipsoids containing void(s) such that the total volume of the void(s) is preferably about 10 to about 98% of the volume of the glass ellipsoids, more preferably about 25 to about 95% of the volume of the glass ellipsoids; hollow ceramic ellipsoids containing void(s) such that the total volume of the void(s) is preferably about 10 to about 98% of the volume of the ceramic ellipsoids, more preferably about 25 to about 95% of the volume of the ceramic ellipsoids; glass fibers; ceramic fibers; and mixtures thereof. More preferably, the core particles are selected from the group consisting of hollow glass microspheres, hollow ceramic microspheres, glass fibers, ceramic fibers and mixtures thereof.

Preferably, the surface of the core particle is non-porous, to be better able to receive and support a coating of a preferably at least substantially continuous (more preferably continuous) film. For ease of applying the coating, it is preferable that the core particles have a relatively low surface area, not exhibit excessive agglomeration and be compatible with vacuum processing. For the core particles, an average surface area of less than about 20 $m^2$lgm is preferable, less than about 10 $m^2$/gm is more preferable, and less than about 5 $m^2$/gm is most preferable. If the average surface area is too high, it is difficult to obtain a coating that is thick enough to provide the desired conductivity (in order to provide the desired volume resistivity of the coated particles) under, economically feasible manufacturing conditions.

The dimensions of the core particles can vary. For core particles, size is defined to be the mean major particle dimension, for example, the mean length of a glass fiber. As another example, for spherical particles, the mean major particle dimension would be the mean particle diameter. It is preferred that the mean major particle dimension of the core particles and also the mean major particle dimension of the coated particles, be smaller than about one centimeter, more preferably from about 1 to about 2,000 micrometers, and most preferably from about 10 to about 1,000 micrometers.

The core particles are preferably light colored. The properties of "light colored" and color are quantified herein using a spectrophotometer, such as a Hunter Labscan™ 6000. A standard color model is the CIE (International Commission on Illumination) 1976 (L*a*b*) color space, which gives values for lightness as L*, with 100 being very light and 0 being very dark. The value a* is an indication of red or green color, with positive numbers corresponding to red, negative numbers green. The value b* indicates yellow and blue, with positive numbers indicating yellow, negative numbers indicating blue. The closer the values and a* and b* are to zero the more neutral or weak the color.

The CIELAB 1976 L*a*b* color-difference formula is used herein to quantify "light-colored." This formula is the vector summation of the differences in the L*, a*, and b* values of two materials. (Hunter, Richard S. and Harold, Richard W., *The Measurement of Appearance*, 2nd Edition, John Wiley and Sons, 1987.) The formula is:

$$\Delta E^*=((L_1^*-L_2^*)^2+(a_1^*-a_2^*)^2+(b_1^*-b_2^*)^2)^{1/2}$$

where: $\Delta E^*$ is the color difference between two materials;

$L_1^*$, $a_1^*$, $b_1^*$ indicate the reference color, in this case perfect white ($L_1^*=100$, $a_1^*=0$, $b_1^*=0$); and $L_2^*$, $a_2^*$, $b_2^*$ indicate the color of the material being measured.

Inserting the values for the reference white and dropping the subscripts gives:

$$\Delta E_w^*=((100-L^*)^2+(a^*)^2+(b^*)^2)^{1/2}$$

where: $\Delta E_w^*$ is the "distance from white" and L*, a*, and b* indicate the color of the material being measured.

Small values for $\Delta E_w^*$ indicate colors that are close to the reference white, i.e., "light colored." More specifically, light colored core particles means core particles having a $\Delta E_w^*$ that is less than about 50, preferably less than about 40, and more preferably less than about 30.

In addition, in order to achieve the desirable values of $\Delta E_w^*$ for the core particles, the preferred values of L*, a*, and b* for the core particles are L* greater than about 60, a* between about −10 and about +10 and b* between about 0 and about 30. More preferred values for core particles are L* greater than about 70, a* between about −10 and about +10 and b* between about 0 and about 30. Most preferred values for core particles are L* greater than about 80, a* between about −5 and about +5 and b* between about 0 and about 25.

The core particles (i.e., uncoated particles) are preferably not light permeable, with a total luminous transmission, or TLT, of preferably less than 80% when 2 weight per cent of the core particles and 98 weight per cent of ethylene glycol are mixed, the resulting mixture placed in a quartz cell having 1 mm of optical path length, and its transmittance measured by means a hazemeter according to ASTM D1003. More preferably, the total light transmission is less than about 60%, even more preferably less about 30%. Core particles that are not light permeable are desirable because they allow coated particles and static dissipative composites that are opaque or not light permeable. This is an advantage when one is making a static dissipative floor covering that will go over a darker surface, such as concrete or a black primer coat.

Coatings

The conductive coatings used herein are preferably light colored. The coatings that are useful according to this invention are from the class of conductive metal oxides. The term "metal oxide" as used herein includes oxides of single metals, oxides of metal alloys, oxides of metals that are doped with halogens, and mixtures thereof Representative examples of metal oxides include indium oxide, tin oxide, and zinc oxide. Representative examples of oxides of metal alloys include indium tin oxide (ITO), antimony tin oxide (ATO), and zinc aluminum oxide (ZAO). Representative examples of doped metal oxides include halogen doped tin oxide, such as chlorine doped tin oxide and fluorine doped tin oxide. Preferably the coatings comprise indium tin oxide.

The metal oxide of the coating should be conductive enough (not all metal oxides are conductive) to provide a coated particle that has a conductivity such that the coated particles have the required volume resistivity. Additionally, the metal oxide of the coating should be light colored enough to provide a coated particle that has the requisite light color.

Preferably, the coating is sufficiently thick to form a substantially continuous, more preferably continuous, coating that is conductive. If the coating is too thin, the coating will not have the conductivity that will provide the coated particles with the required volume resistivity. If the coating is too thick, the coated particles will become medium or dark colored, i.e., not have the required $\Delta E_w^*$ values, and in some cases may have a dark yellowish color. In order to have the best combination of a low $\Delta E_w^*$ and appropriate volume resistivity, the thickness of the coating preferably ranges from about 2 to about 100 nanometers, more preferably from about 2 to about 80 nanometers, and most preferably from about 5 to about 50 nanometers.

Coated Particles

The coated particles of the invention comprise the core particles having conductive metal oxide coatings adhered to the core particles. The core particles and the metal oxide coatings are selected to provide light colored conductive coated particles. The coated particles of the invention are required to be light colored. The core particles and coatings by themselves may be both light colored or only one may be light colored as long as the coated particles themselves are light colored. For example, the core particle may not have to be light colored as that term is defined herein, as long as the coating is sufficiently light colored and thick enough such that the coated particle itself is light colored. As another example, the core particle may be so light colored that if a coating which is not light colored is applied in a thin enough coating the resultant coated particle may be light colored due to the lightness of the core particles.

The $\Delta E_w^*$ of the coated particles of the invention when measured as described earlier herein, is less than about 50, preferably less than about 40, and more preferably less than about 30. In order to achieve the desired values of $\Delta E_w^*$ for the coated particles, the preferred values for L*, a*, and b* for the coated particles are L* greater than about 60, a* between about −10 and about +10 and b* between about 0 and about 30. More preferred values are L* greater than about 70, a* between about −10 and about +10 and b* between about 0 and about 30. Most preferred values are L* greater than about 80, a* between about −5 and about +5 and b* between about 0 and about 25.

Since conductivity is the inverse of resistivity, conductive coated particles are defined as coated particles having a low volume resistivity. The coated particle volume resistivity, when measured as described later herein, should be less than about 1000 ohm-cm and greater than about 0.1 ohm-cm, preferably less than about 500 ohm-cm and greater than about 1 ohm-cm, and more preferably less than about 300 ohm-cm and greater than about 10 ohm-cm. If the coated particle volume resistivity is too high (i.e., the particles are not conductive enough), composites made with these coated particles will have too high a surface and/or volume resistivity. Conversely, if the coated particle volume resistivity is too low (i.e., the particles are too conductive) composites made with these coated particles will have too low a surface and/or volume resistivity (i.e., the composites will be too conductive).

Method of Coating Particles

The coating is applied to the particles by physical vapor deposition (PVD). More preferably the coating is applied to the particles by sputter coating, which is a form of physical vapor deposition.

The core particles may optionally be prepared for coating by drying them in an air oven at about 80 to 250° C., typically about 175° C. for about 1 to about 24 hours, typically about 2 hours. This step removes any moisture that may be absorbed onto the surface of the core particles. Drying the core particles before placing them into the vacuum chamber reduces the time required to pump down the vacuum system to the desired starting pressure. The temperature and drying time may be adjusted to suit the type of core particle, for example polymer core particles that may be affected by a high temperature.

Next, typically the dry core particles are placed in the vacuum chamber and air is removed from the chamber by pumping it down. A background pressure in the range of about $10^{-6}$ torr to about $10^{-4}$ torr is typical. Once the system has achieved suitable background pressure, a sputtering gas, typically argon, is added in sufficient quantity to obtain a background pressure of about 1 to 10 millitorr, typically about 3 millitorr.

The source of the coating material, commonly referred to as a sputtering target, may for example, be in the metallic form, such as indium tin alloy, or the source of the coating material may, for example, be in the metal oxide form, such as indium tin oxide when sputter coating PVD is employed.

When the sputtering target is metallic, for example indium-tin metal alloy, oxygen should be added during the sputter coating process in order to produce a coating that is at least partially oxidized. If no oxygen is added to the system while sputter coating with a metallic target, the coatings will be metallic. It can then be difficult to oxidize these metallic coatings with a simple oxidizing step. One potential cause for this difficulty is that the coating might oxidize on the surface layer only, and not throughout the thickness of the metal coating. These particles would retain the dark color appearance of the metal. Another possible cause for this difficulty is that when heated, the coating may become discontinuous to such a degree that it is not conductive.

It is possible to introduce sufficient oxygen to the sputter coating system when a metallic sputtering target is used to provide coatings that are desirably light colored and conductive. However, if too much oxygen is added during the sputtering process, problems such as "target poisoning" with a reduction in the rate of sputtering can occur. It can be difficult to maintain the proper amount of oxygen to achieve particles of the desired resistivity and $\Delta E_w^*$ while maintaining good sputtering rates and equipment performance.

Therefore, it has been found that the preferable process when sputter coating with a metallic sputtering target is to provide enough oxygen during the sputtering step to partially oxidize the coating, then complete the oxidation with an oxidizing step in an oxygen containing environment, such as air, after the coating step.

For indium tin oxide targets, the known conventional procedure for producing indium tin oxide coatings on flat substrates, such as glass plates or rolls of polymer film, is to add oxygen during the sputtering process. However, I have discovered that, surprisingly, the preferable process for coating core particles using an indium tin oxide target, according to the present invention, is to add no oxygen during the sputtering process. This produces coated particles of suitable volume resistivity and color, $\Delta E_w^*$. It was found that adding even small amounts of oxygen during sputter coating when using an indium tin oxide target produced coated particles that were dark yellow and had unsuitable volume resistivity.

The volume resistivity and $\Delta E_w^*$ of coated particles made using either a metallic or metal oxide target, may be further decreased by a heating step in the presence of oxygen, such as in air, after processing. However, the ability to produce a coating that is adequately conductive to provide coated particles with the desired volume resistivity and light color by sputtering from a metal or metal oxide target, without a heating step after processing, is very advantageous. This allows the coating of heat sensitive core particles, such as polymer beads, that would otherwise be destroyed by such a heating step.

To produce halogen doped metal oxide coatings the sputter coating may be done in the presence of a halogen containing gas, for example $CF_4$, while using either a metallic or metal oxide sputtering target. Oxygen may also be used in the system.

The vacuum sputtering system is typically operated in DC magnetron mode. The core particles are typically tumbled slowly under the sputtering target. The sputtering time and power level are chosen to produce coatings that are thick enough to provide coated particles with the required volume resistivity and which are preferably at least substantially continuous (more preferably continuous) on substantially all (more preferably all) of the particles. Typically the sputtering time ranges from about 2 to about 24 hours, and the power level is from about 1 to about 8 kilowatts. The examples that follow provide specific details of typical conditions. As described above, oxygen will preferably be added to the chamber during sputtering when using a metallic target. However, oxygen will preferably not be added to the chamber during sputtering when using a metal oxide target, that is sputtering will take place in an oxygen free environment. After the sputter coating step, with either a metallic or metal oxide target, the coated particles may be further oxidized, for example by heating in an oxygen containing atmosphere, such as air, in order to reduce the volume resistivity and provide the desired $\Delta E_w^*$.

This sputter coating process is surprisingly efficient and cost effective for producing coated particles. It provides a conductive metal oxide coating on the particles that is typically continuous and uniform and adheres strongly to the core particle. This manufacturing process is a vacuum process that is dry and environmentally clean. It does not involve solvents or liquid waste material. The metal or metal oxide coating material is almost entirely captured on the particles. The major source of waste is the metal or metal oxide left in the spent sputtering target. This metal or metal oxide is in a solid form that is easily reclaimable and recyclable.

Composites

The static dissipative composites comprise the light colored conductive coated particles in a polymeric binder material(s). The polymeric binder material may be a polymer resin, for example. Examples of useful polymer resins include, but are not limited to, thermosets, such as epoxies and urethanes; thermoplastics, such as polyesters, polycarbonates, polysulfones, polystyrene, polyvinyl chlorides, polyethers, polytetrafluoroethylene (PTFE), and polyetherimide (PEI); polyolefins, such as polyethylene, polypropylene, ethylene-propylene copolymer; and mixtures thereof.

The composites are light colored with a $\Delta E_w^*$, measured as described herein, of preferably less than about 50, more preferably less than about 40, and most preferably less than about 30.

In addition, in order to achieve the preferred $\Delta E_w^*$ values, preferred values for L*, a*, and b* for the composites are L* greater than about 60, a* between about −10 and about +10 and b* between about 0 and about 40. More preferred values for the composites are L* greater than about 70, a* between about −10 and about +10 and b* between about 0 and about 40. Most preferred values for the composites are L* greater than about 80, a* between about −5 and about +5 and b* between about 0 and about 35.

The static dissipative composites have a surface resistivity between $10^5$ and $10^{12}$ ohms per square and/or volume resistivity between $10^4$ and $10^{11}$ ohm-cm. Preferably the static dissipative composites have a surface resistivity between $10^6$ and $10^9$ ohms per square and/or volume resistivity between $10^5$ and $10^8$ ohm-cm.

In order to obtain the desired static dissipative resistivity, the coated particles must be added to the polymeric material in sufficient quantity to create a network of conductive paths through the material. The required quantity of coated particles will vary depending on the shape of the particles. Spherical coated particles, such as coated glass or ceramic microspheres, require a relatively high volume loading, typically in the range of about 30 to about 50% based on the total volume of the composite, to achieve static dissipative properties in the composite. Cylindrical coated particles, such as coated glass fibers, require a lower volume loading, typically in the range of about 10 to about 25%, based on the total volume of the composite, to achieve static dissipative properties in the composite. The aspect ratio, or ratio of the fiber length to the fiber diameter, will also influence the required volume loading. Extremely small coated particles, particularly those under one micron in size, may tend to agglomerate, and form a conducting network at fairly low volume loadings. Overall, a composite typically requires from about 5 to about 65% volume loading of coated particles based on the total volume of the composite in order to achieve static dissipative properties.

The light colored, static dissipative composites have many uses, including, but not limited to light colored static dissipative molding compounds, and liquid applied coatings which may be applied by brush, roller or spray. An example of one type of liquid applied coatings is a static dissipative flooring. The light color, or low $\Delta E_w^*$, of the coated particles allows the production of flooring in aesthetically attractive, light colored shades, such as light beige or cream colors. Another example is static dissipative molding compounds that can be used to make molded parts, such as computer housings, and trays or totes for handling electronic components. The light color, or low $\Delta E_w^*$, of the coated particles allows static dissipative molded parts to be made which have light colors or which can be easily colored with pigments for attractive packaging or color coding of trays.

DEFINITIONS AND TEST METHODS

Measuring Volume Resistivity of Coated Particles

The coated particle volume resistivity was measured using the following procedure. A test cell comprising an acetyl block containing a cylindrical cavity with circular cross section of 1.0 $cm^2$ was used. The bottom of the cavity was covered by a brass electrode. The other electrode was a 1.0 $cm^2$ cross section brass cylinder that fit snugly into the cavity. The coated particles to be tested were placed in the cavity, and then the brass cylinder was inserted. A weight was placed on top of the brass cylinder to exert a total pressure of 124 kiloPascals (18 psi) on the coated particles. The electrodes were connected to a digital multimeter to measure resistance. When the coated particle bed was 1.0 cm high, the observed resistance was equivalent to the coated particle volume resistivity in ohm-cm.

Measuring Surface Resistivity of Static Dissipative Composites

The surface resistivity of the static dissipative composites was measured using a Model 272A Portable Surface Resistivity/Resistance Meter from Monroe Electronics (Lyndonville, N.Y., U.S.A.). The test procedure is described in ASTM D257. The measurement was made on the surface of a composite that had been spread or "drawn down" to a thickness of 1 millimeter on a non-conductive backing (white Leneta Form 2A card, Leneta Co., Mahwah, N.J., U.S.A.). As the name implies, surface resistivity is measured across the surface of a material. Its units are given in "ohms per square." All measurements were made at 10 volts DC (direct current).

The surface resistivity of a composite having a thickness greater than one millimeter can be measured by slicing off a section of composite having a one millimeter thickness, placing this on an insulating surface (for example the white Leneta card described above) and performing the surface resistivity test on the one millimeter thick section.

Measuring Volume Resistivity of Static Dissipative Composites

The volume resistivity of a static dissipative composite was measured using the Monroe Model 272A meter following Monroe Application Note ES-41, "Practical Volume Resistivity Measurements." The volume resistivity was measured through the thickness, or volume of a material. The volume resistivity is equal to the measured resistance multiplied by the area of the electrodes and divided by the thickness of the composite. It is given in "ohms-cm." All measurements were made at 10 volts DC (direct current).

Measurement of Total Luminous Transmission

Total luminous transmission (TLT) of the particles to be tested, such as the core particles, for example, was measured according to ASTM D1003-92. The measurements were made with a Perkin Elmer (Norwalk, Conn., U.S.A.) Lambda 19™ Spectrophotometer fitted with an RSA-PE-19a integrating sphere accessory. This sphere was 150 mm in diameter. The particles to be tested were made into 2% suspensions by weight in ethylene glycol. Spectra were taken using optical glass sample cells with 1.0 cm path, 5 cm width, and 5 cm height. Total luminous transmission is the total of all light passing through the sample whether scattered or not, expressed as a per cent of light entering the cell.

Measurement of CIELAB Color

The color was quantified using a Hunterm Labscan 6000 (Hunter Associates Laboratory, Reston, Va., U.S.A.). This instrument measures the reflectance of light from a sample and provides three values: L*, a*, and b*. Of these L* is an indication of lightness of a material, with 100 being very light, and 0 being very dark. The value a* is an indication of red or green color, with positive numbers corresponding to red, negative numbers green. The value b* indicates yellow and blue, with positive numbers indicating yellow, negative numbers indicating blue.

The CIELAB 1976 L*a*b* color-difference formula relative to white is used herein to quantify "light-colored." (This equation is derived earlier herein.)

$$\Delta E_w^*=((100-L^*)^2+(a^*)^2+(b^*)^2)^{1/2}$$

where $\Delta E_w^*$ is the "distance from white" and L*, a*, and b* indicate the color of the material being measured.

Composites, for example epoxy based composites, may be prepared for measurement by coating the uncured material onto white Leneta Form 2A cards (Leneta Co., Mahwah, N.J., U.S.A.) to a thickness of 1 millimeter. This is allowed to cure before measurement. The L*, a*, b* measurements are made on the white portion of the Leneta cards using the CIELAB model, with the F2 illuminant (cool white fluorescent light), 13 mm (0.5") aperture, and a 10° Standard Observer.

Composites having a thickness greater than one millimeter can be measured by slicing off a section of composite having a one millimeter thickness, adhering this to a Leneta card, and performing the CIELAB color measurement on the one millimeter thick section.

Particles, for example coated particles or core particles, may be measured by putting the particles in a flat, transparent container to a depth of approximately 13 mm. A white backing tile (Hunter LS-13870) is placed over the container about 25 mm above the particles. The measurements are made with the CIELAB model, F2 Illuminant, 13 mm (0.5") aperture, and 10° Standard Observer.

Calculating Coated Particle Average Coating Thickness

The average thickness of the conductive coating on a sample of coated particles was estimated using the following relationship:

$$t=10*C*W/(D*S)$$

Where:

- t represents the average thickness of the coating in nanometers;
- W represents the average weight percent of the major metal (or metal in the greatest amount) by weight in the coating on a sample of coated particles, based on the total weight of the coated particles (the procedure for measuring this is described below);
- D represents the density of the coating in grams per cubic centimeter (g/cc) (for example indium tin oxide is 7.3 gm/cc);
- S represents the average surface area of the coated particles in meters squared per gram ($m^2/g$) (the procedure for measuring this is describe below); and
- C is a conversion factor for converting from metal thickness to metal oxide thickness and accounting for the presence of multiple metals, as in indium tin oxide (the procedure for determining this is described below).

Procedure for Determining C, Conversion Factor for Metal Oxide Thickness

C is a conversion factor for obtaining the thickness of a coating that may include more than one metal and/or metal compound, including metal oxides. If the metal composition is given by weight, the formula is established on an atomic basis. This is accomplished by dividing the ratios by the atomic weights of the metals. For example, the indium tin metal targets are 90% indium, 10% tin by weight. Dividing through by the atomic weights of indium and tin gives a ratio of 9.3 atoms of indium for each atom of tin. Since indium oxide is $In_2O_3$, and tin oxide is $SnO_2$, the formula for indium tin oxide (from a 90% In/10% Sn target) is:

$$9.3(InO_{1.5})\cdot 1(SnO_2)$$

This reduces to:

$$In_{1.0}Sn_{0.11}O_{1.72}$$

The conversion factor, C, is the ratio of the formula weight of the coating (for example indium tin oxide) divided by the atomic weight of the metal for which the weight per cent data is supplied (for example indium). Continuing with the example of indium tin oxide, adding together the atomic weights gives a formula weight of 155.54 for ITO. Since, the atomic weight of indium is 114.82, the conversion factor, C, is 155.54/114.82 or 1.35.

Procedure for Measuring W, Weight Per Cent Metal in the Coating of Coated Particles The average weight percent of metal, W, in the coating can be determined by dissolving the coating in hydrochloric acid. The solution is then analyzed by the technique of Inductively Coupled Argon Plasma Atomic Emission Spectroscopy, as described in M. Thompson and J. Walsh, *Handbook of Inductively Coupled Plasma Spectrometry*, Chapman and Hall, 1983, incorporated by reference herein. If more than one kind of metal is present in the coating, for example in indium tin alloy, the weight per cent of the metal present in the largest amount by weight is used for W. The conversion factor, C, which is explained above, accounts for the fraction of other metals in the coating.

Procedure for Measuring S, Average BET Surface Area of Coated Particles

The average surface area of the core particles or coated particles (if one is trying to determine the average coating thickness) can be determined using the Brunauer, Emmett, Teller method (BET), as described in T. Allen, *Particle Size Measurement*, 3rd edition, Chapman and Hall, 1981, incorporated by reference herein.

EXAMPLES

The following non-limiting examples further illustrate the present invention.

Example 1

One kilogram of dried S60/10000 SCOTCHLITE™ hollow glass microspheres from 3M Company (St. Paul, Minn., U.S.A.) were placed in a vacuum system. The total luminous transmission (TLT) of these hollow glass microspheres was 10% when measured as described above. These core particles were tumbled in the chamber while being sputter coated with indium tin oxide (ITO). The sputtering target was a 12.7 cm×30.5 cm (5"×12") rectangular cathode with a composition of 90% indium, 10% tin by weight. The argon sputtering gas pressure was about 3 millitorr. The cathode was operated in the DC magnetron mode at 2.0 kilowatts for 310 minutes. Oxygen was added to the system at a flow rate of 80 standard cubic centimeters per minute (sccm).

The coated particles were black in color, indicating that the coating was not fully oxidized. These coated particles were placed in an oven in air at 400° C. for 20 minutes. The resulting coated particles had a volume resistivity of 170 ohms-cm, which is a desirable level for volume resistivity, and had a $\Delta E_w^*$ of 22, which indicates a light color. Table 1 lists the results of various measurements on these coated particles.

Next, 6.2 grams of these indium tin oxide (ITO) coated particles were mixed into 14.5 grams of Epon™ 813 epoxy resin from Shell (Houston, Tex., U.S.A.). Then 2.61 grams of Epicure™ 3271 curing agent, also from Shell was added and mixed in. This mixture was 40% by volume ITO coated hollow glass microspheres.

The Epon™ 813 resin is a modified bisphenol A-epichlorohydrin based epoxy resin. The Epicure™ 3271 cure agent is diethylenetriamine in bisphenol A. The density of the Epon™ 813 resin with Epicure™ 3271 curing agent is 1.14 gm/cc, according to Shell.

This coated particle and epoxy mixture was spread onto a white card (Leneta Form 2A, from Leneta Co., Mahwah, N.J., U.S.A.) to a thickness of one millimeter and an area of about 10 cm by about 20 cm. This mixture was allowed to cure for a minimum of 24 hours in air at room temperature before being tested. This produced a composite that had a $\Delta E_w^*$ of 22, which indicates light color, and a surface resistivity of $9.5\times10^5$ ohms/square, which is static dissipative. Table 2 lists the results of measurements made on this composite.

This example demonstrates light colored, conductive coated particles made from a hollow core particles and a light colored static dissipative composite made from these coated particles. Note the low $\Delta E_w^*$ value for this light colored static dissipative composite.

Example 2

One and one half kilograms of dried milled glass fibers (3016) from Fibertec of Bridgewater, Mass., U.S.A. were coated with indium tin oxide as described in Example 1, except for the following differences. The TLT of these uncoated glass fibers was 60% when measured as described above. The sputtering target was indium-tin oxide with a ratio of 90% indium oxide and 10% tin oxide by weight. The power level was 3.0 kilowatts, the sputtering time 148 minutes. No oxygen was added during sputtering. These coated glass fibers were placed in an oven in air at 400° C. for 20 minutes. The resulting ITO coated glass fibers had a volume resistivity of 110 ohm-cm, which is a desirable level for volume resistivity, and had a $\Delta E_w^*$ of 25, which indicates light color. Table 1 lists the results of various measurements on these conductive coated particles.

Thirteen grams of these ITO coated glass fibers were mixed into 19.3 grams of epoxy resin (Shell Epon™ 813) and 3.5 grams of cure agent (Shell 3271™) to produce a mixture with 20% by volume coated glass fibers. This mixture was spread onto a white Leneta™ card and allowed to cure, as described in Example 1, to a thickness of one millimeter. This produced a composite with a $\Delta E_w^*$ of 40, which indicates light color, and a surface resistivity of $2.0\times10^{10}$ ohms/square, which is static dissipative. Table 2 lists the results of measurements made on this composite.

Example 3

Two and one half kilograms of dried Zeeosphere™ W610 ceramic microspheres from 3M (St. Paul, Minn., U.S.A.) were coated as described in Example 1, except for the following differences. The TLT of these uncoated ceramic microspheres was 34%. The sputtering target was indium-tin oxide with a ratio of 90% indium oxide and 10% tin oxide by weight. The coating time was 16 hours at a power level of 3 kilowatts. These coated ceramic microspheres were placed in an oven in air at 400° C. for 20 minutes. The resulting ITO coated ceramic microspheres had a volume resistivity of 260 ohm-cm, which is a desirable level for volume resistivity and had a $\Delta E_w^*$ of 22, which indicates a light color. Table 1 lists the results of various measurements on these ITO coated ceramic microspheres.

Twenty-four grams of these coated ceramic microspheres were mixed into 14.0 gm of epoxy resin (Shell Epon™ 813) and 2.5 gm of cure agent (Shell 3271™) to produce a mixture with 40% by volume coated ceramic microspheres. This mixture was spread onto a white Leneta™ card and allowed to cure, as described in Example 1, to a thickness of one millimeter. This produced a composite that had a $\Delta E_w^*$ of 45, which indicates light color, and a surface resistivity of $3.0\times10^{10}$, which is static dissipative. Table 2 lists the results of measurements made on this composite.

Comparative Example 4

A Dried S60/10000 SCOTCHLITE™ hollow glass microspheres from 3M Company (St. Paul, Minn., U.S.A.) were sputter coated as described in U.S. Pat. No. 5,529,708 (Palmgren et al.), incorporated herein by reference. The coating conditions were chosen to obtain a coating thickness of 9 to 10 nanometers (nm). The sputtering target was 304 stainless steel. No oxygen was added during the processing. The particles were not subsequently heat treated. The resulting stainless steel coated hollow glass microspheres had a volume resistivity of 9.1 ohm-cm, which is a desirable level for volume resistivity, however they had a $\Delta E_w^*$ of 63, which indicates a dark color. Table 1 lists the results of various measurements on these coated particles.

Next, 6.1 grams of these stainless steel coated hollow glass microspheres were mixed into 14.4 grams of Shell Epon™ 813 epoxy resin and 2.7 grams of Shell Epicure™ 3271 cure agent to produce a mixture with 40% by volume coated particles. This mixture was spread onto a white Lenetawm card and allowed to cure, as described in Example 1, to a thickness of one millimeter. This produced a composite that had a surface resistivity of $9.0\times10^9$ ohm/square, which is static dissipative; however, the $\Delta E_w^*$ was 78, which indicates a dark color. Table 2 lists the results of measurements made on this composite.

This example demonstrates that these prior art metal coated particles are not light colored and do not provide a light colored composite.

Example 5

The indium tin oxide coated hollow glass microspheres of Example 1 were also made into a sample suitable for volume resistivity measurements. First 6.2 grams of these ITO coated particles were mixed into 14.5 grams of Epon™ 813 epoxy resin from Shell. Next 2.61 grams of Epicure™ 3271 curing agent, also from Shell was mixed in. This composite had 40% ITO coated hollow glass microspheres by volume. Then this composite was spread onto a release liner to a thickness of 2.3 millimeters and a circular area of about 10 cm diameter and allowed to cure in air at room temperature for a minimum of 24 hours. The volume resistivity of this sample was measured using the procedure described above. The volume resistivity was $6.3\times10^8$ ohm-cm, which is indicative of static dissipative resistivity. The $\Delta E_w^*$ value of this composite, which was opaque at this thickness, was 28 (with L*=85, a*=−2.9 and b*=23) which is indicative of light color.

TABLE 1

Coated Particle Data

| Example | Description of Coated Particles | Coated Particle Volume Resistivity (ohm-cm) | Average BET Surface Area ($m^2$/gm) | Average Weight % Metal (based on the weight of the particles) | Average Coating Thickness (nanometers) | CIELAB for Coated Particles $\Delta E_w^*$ | L* | a* | b* |
|---|---|---|---|---|---|---|---|---|---|
| 1 | ITO on hollow glass microspheres | 170 | 0.76 | 3.2 Indium | 7.9 | 22 | 87 | −2.3 | 17 |
| 2 | ITO on glass fibers | 110 | 0.21 | 1.0 Indium | 8.8 | 25 | 83 | −2.5 | 18 |
| 3 | ITO on ceramic microspheres | 260 | 1.28 | 2.4 Indium | 3.5 | 22 | 91 | −1.9 | 20 |
| Comparative 4 | Steel on hollow glass microspheres | 31 | 0.45 | 2.3 Iron | 9.1 | 63 | 37 | −0.2 | 0.9 |

TABLE 2

Static Dissipative Composite Data

| Example | Description of Coated Particles in Composite | Volume Loading of Coated Particles in Composite (%) | Surface Resistivity (ohms per square) of Composite | CIELAB of Composite $\Delta E_w^*$ | L* | a* | b* |
|---|---|---|---|---|---|---|---|
| 1 | ITO on hollow glass microspheres | 40 | $9.5 \times 10^5$ | 22 | 86 | −2.6 | 17 |
| 2 | ITO on glass fibers | 20 | $2.0 \times 10^{10}$ | 40 | 77 | −3.9 | 33 |
| 3 | ITO on ceramic microspheres | 40 | $3.0 \times 10^{10}$ | 45 | 72 | −1.9 | 35 |
| Comparative 4 | Steel on hollow glass microspheres | 40 | $9.0 \times 10^9$ | 78 | 22 | 0.0 | 0.6 |

While this invention has been described in terms of specific embodiments it should be understood that it is capable of further modification. The claims herein are intended to cover those variations one skilled in the art would recognize as the equivalent of what has been described here.

I claim:

1. A method comprising the steps of:

(a) providing a plurality of core particles wherein each particle independently comprises a material selected from the group consisting of inorganic materials and polymeric materials and wherein each particle has a major particle dimension of less than 1000 microns;

(b) applying a conductive coating comprising a conductive metal oxide selected from the group consisting of indium oxide, tin oxide, indium tin oxide, antimony tin oxide, zinc aluminum oxide, chlorine doped tin oxide, and fluorine doped tin oxide on each particle by physical vapor deposition sputter coating process such that the conductive oxide coating is adhered to each core particle, in order to form a composition comprising a plurality of coated particles, wherein the coated particles have a $\Delta E_w^*$ value; and (c) optionally heating the composition in an atmosphere comprising oxygen to decrease the $\Delta E_w^*$ value of the coated particles;

wherein it is required that upon completion of step (b) or step (c), if step (c) is included, that the coated particles have a volume resistivity of greater than 0.1 ohm-cm and less than 1000 ohm-cm; and wherein at least one of the following of (I) and (II) is true:

(I) wherein the coated particles after step (b) have a $\Delta E_w^*$ value of less than 50;

(II) wherein the coated particles after step (c), if included, have a $\Delta E_w^*$ value of less than 50.

2. The method of claim 1 wherein the sputter coating process employs a metal oxide sputtering target and the sputter coating process takes place in the absence of oxygen.

3. The method of claim 1 wherein the sputter coating process employs a metallic sputtering target and the sputter coating process takes place in the presence of oxygen, and wherein step (c) occurs.

4. The method of claim 1 wherein the coated particles have a volume resistivity of greater than 1 ohm-cm and less than 500 ohm-cm.

5. The method of claim 1 wherein the coated particles have a volume resistivity of greater than 10 ohm-cm and less than 300 ohm-cm.

6. The method of claim 1, wherein at least one of the following of (I) and (II) is true:

(I) the coated particles after step (b) have a $\Delta E_w^*$ value of less than 40;

(II) the coated particles after step (c), if included, have a $\Delta E_w^*$ value of less than 40.

7. The method of claim 1, wherein at least one of the following of (I) and (II) is true:

(I) the coated particles after step (b) have a $\Delta E_w^*$ value of less than 30;

(II) the coated particles after step (c), if included, have a $\Delta E_w^*$ value of less than 30.

8. The method of claim 1 wherein the coated particles have an L* value greater than 60, an a* value between −10 and +10, and a b* value between 0 and 30.

9. The method of claim 1 wherein the coated particles have an L* value greater than 70, an a* value between −10 and +10, and a b* value between 0 and 30.

10. The method of claim 1 wherein the coated particles have an L* value greater than 80, an a* value between −5 and +5, and a b* value between 0 and 25.

11. The method of claim 1 wherein the core particles are selected from the group consisting of glass, ceramic(s), mineral(s), and mixtures thereof.

12. The method of claim 11 wherein the minerals are selected from the group consisting of wollastonite, mica, perlite, and mixtures thereof.

13. The method of claim 1 wherein the polymeric material is selected from the group consisting of polycarbonate, nylon, acrylonitrile-butadiene-styrene copolymer, and mixtures thereof.

14. The method of claim 1 wherein the core particles have a shape selected from the group consisting of granular, plates, flakes, acicular, rods, fibers irregular, ellipsoidal, and mixtures thereof.

15. The method of claim 1 wherein the core particles are selected from the group consisting of solid ceramic microspheres, glass flakes, glass frit, perlite, polymer granules, polymer microspheres, polymer fibers, and mixtures thereof.

16. The method of claim 15 wherein the polymer granules are selected from the group consisting of polycarbonate, nylon, acrylonitrile-butadiene-styrene, and mixtures thereof.

17. The method of claim 1 wherein the core particles are selected from the group consisting of ceramic ellipsoids containing void(s) such that a total volume of the void(s) is 10 to 98 percent of a total volume of the ceramic ellipsoids, glass ellipsoids containing void(s) such that a total volume of the void(s) is 10 to 98 percent of a volume of the glass ellipsoids, and mixtures thereof.

18. The method of claim 1 wherein the core particles are selected from the group consisting of ceramic ellipsoids containing void(s) such that a total volume of the void(s) is 25 to 95 percent of a total volume of the ceramic ellipsoids, glass ellipsoids containing void(s) such that a total volume of the void(s) is 25 to 95 percent of a volume of the glass ellipsoids, and mixtures thereof.

19. The method of claim 1, wherein the core particles are hollow glass microspheres.

20. The method of claim 1, wherein the core particles are hollow ceramic micro spheres.

21. The method of claim 1, wherein the core particles are glass fibers.

22. The method of claim 1, wherein the core particles are ceramic fibers.

23. The method of claim 1, wherein the core particles have a Total Luminous Transmission of less than 80%.

24. The method of claim 1, wherein the core particles have a Total Luminous Transmission of less than 60%.

25. The method of claim 1, wherein the core particles have a Total Luminous Transmission of less than 30%.

26. The method of claim 1, wherein the core particles have an average BET surface area of less than 20 $m^2$/gram.

27. The method of claim 1, wherein the core particles have an average BET surface area of less than 10 $m^2$/gm.

28. The method of claim 1, wherein the core particles have an average BET surface area of less than 5 $m^2$/gm.

29. The method of claim 1 wherein the core particles have a mean major particle dimension of 10 to 1000 microns.

30. The method of claim 1, wherein the core particles have a $\Delta E_w^*$ value less than 50.

31. The method of claim 1, wherein the core particles have a $\Delta E_w^*$ value less than 40.

32. The method of claim 1, wherein the core particles have a $\Delta E_w^*$ value less than 30.

33. The method of claim 1 wherein the core particles have an L* value greater than 60, an a* value between −10 and +10, and a b* value between 0 and 30.

34. The method of claim 1 wherein the core particles have an L* value greater than 70, an a* value between −10 and +10, and a b* value between 0 and 30.

35. The method of claim 1 wherein the core particles have an L* value greater than 80, an a* value between −5 and +5, and a b* value between 0 and 25.

36. The method of claim 1 wherein the coating of (b) comprises indium tin oxide.

37. The method of claim 1 wherein the coating of (b) has an average thickness of 2 nanometers to 100 nanometers.

38. The method of claim 1 wherein the coating of (b) has an average thickness of 2 nanometers to 80 nanometers.

39. The method of claim 1 wherein the coating of (b) has an average thickness of 5 nanometers to 50 nanometers.

* * * * *

UNITED STATES PATENT AND TRADEMARK OFFICE

CERTIFICATE OF CORRECTION

PATENT NO. : 6,395,149 B1

DATED : May 28, 2002

INVENTOR(S) : Palmgren, Charlotte M.

It is certified that error appears in the above-identified patent and that said Letters Patent is hereby corrected as shown below:

Title page,
Item [54], "METHOD OF MAKING LIGHT COLORED, ELECTRICALLY CONDUCTIVE COATED PARTICLES" should read -- A METHOD OF MAKING LIGHT COLORED, ELECTRICALLY CONDUCTIVE COATED PARTICLES --.

Column 2,
Line 66, "1 min" should read -- 1 mm --.

Column 3,
Line 67, "means a hazemeter" should read -- means of a hazemeter --.

Column 4,
Line 43, "system can controlled" should read -- system can be controlled --.

Column 5,
Line 14, "flagiwara" should read -- Hagiwara --.

Column 6,
Line 30, "whip" should read -- which --.

Column 10,
Line 1, "inorganic m materials" should read -- inorganic materials --.
Line 65, "20 $m^2$lgm" should read -- 20 $m^2$/gm --.

Signed and Sealed this

Twenty-eighth Day of January, 2003

JAMES E. ROGAN

*Director of the United States Patent and Trademark Office*